(12) United States Patent
Yu et al.

(10) Patent No.: US 7,045,397 B1
(45) Date of Patent: May 16, 2006

(54) JFET AND MESFET STRUCTURES FOR LOW VOLTAGE HIGH CURRENT AND HIGH FREQUENCY APPLICATIONS

(75) Inventors: Ho-Yuan Yu, Saratoga, CA (US);
Valentino L. Liva, Los Altos, CA (US)

(73) Assignee: Lovoltech, Inc., Santa Clara, CA (US)

( * ) Notice: Subject to any disclaimer, the term of this patent is extended or adjusted under 35 U.S.C. 154(b) by 0 days.

(21) Appl. No.: 11/121,381

(22) Filed: May 3, 2005

Related U.S. Application Data

(62) Division of application No. 10/153,012, filed on May 20, 2002, now Pat. No. 6,921,932.

(51) Int. Cl.
*H01L 21/335* (2006.01)

(52) U.S. Cl. ............... 438/135; 438/136; 438/186; 438/556; 438/561; 438/564; 257/135; 257/136

(58) Field of Classification Search ............ 438/136, 438/186, 561, 564, 135
See application file for complete search history.

(56) References Cited

U.S. PATENT DOCUMENTS

| 4,566,172 A | * | 1/1986 | Bencuya et al. | 438/193 |
| 4,845,051 A | * | 7/1989 | Cogan et al. | 438/193 |
| 5,227,647 A | * | 7/1993 | Nishizawa et al. | 257/136 |

FOREIGN PATENT DOCUMENTS

| JP | 04033377 A | * | 2/1992 |

* cited by examiner

*Primary Examiner*—Jerome Jackson
*Assistant Examiner*—José R. Diaz

(57) ABSTRACT

JFET and MESFET structures, and processes of making same, for low voltage, high current and high frequency applications. The structures may be used in normally-on (e.g., depletion mode) or normally-off modes. The structures include an oxide layer positioned under the gate region which effectively reduces the junction capacitance (gate to drain) of the structure. For normally off modes, the structures reduce gate current at Vg in forward bias. In one embodiment, a silicide is positioned in part of the gate to reduce gate resistance. The structures are also characterized in that they have a thin gate due to the dipping of the spacer oxide, which can be below 1000 angstroms and this results in fast switching speeds for high frequency applications.

8 Claims, 19 Drawing Sheets

10

50

```
START
  ↓
APPLY OXIDE AND NITRIDE LAYERS TO SUBSTRATE TO       — 52
PROTECT AREA BETWEEN TRANCHES
  ↓
PERFORM A TRENCH ETCH TO FORM THE TRENCHES           — 54
  ↓
FILL TOP SURFACE AND TRENCHES WITH OXIDE             — 56
DEPOSITION (*CAN SUBSTITUE WITH LOCOS PROCESS)
  ↓
ETCH THE OXIDE BACK, LEAVING OXIDE IN THE            — 58
BOTTOM OF THE TRENCHES
(*CAN SUBSTITUE WITH LOCOS PROCESS)
  ↓
DEPOSIT OXIDE AND NITRIDE AND PERFORM SPACER         — 60
ETCH
  ↓
PERFORM AN OXIDE ETCH TO EXPOSE WINDOWS IN           — 62
THE TRENCH ABOVE THE OXIDE LAYER IN THE WELL
OF THE TRENCH
  ↓
PERFORM POLY LAYER DEPOSITION                        — 64
(DOPED OR UNDOPED/IMPLANT)
  ↓
APPLY SIDE WALL OXIDE TO PROTECT POLY LAYER ON       — 66
THE SIDE WALLS OF THE TRENCH
  ↓
  A
```

FIGURE 2

JFET AND MESFET STRUCTURES FOR LOW VOLTAGE HIGH CURRENT AND HIGH FREQUENCY APPLICATIONS

This patent application is a Divisional of patent application Ser. No. 10/153,012, filed on May 20, 2002 and now U.S. Pat. No. 6,921,932 B1, entitled "JFET AND MESFET STRUCTURES FOR LOW VOLTAGE, HIGH CURRENT AND HIGH FREQUENCY APPLICATIONS", by Yu et al., which is incorporated herein by reference in its entirety.

BACKGROUND OF THE INVENTION

1. Field of the Invention

The present invention relates to the field of semiconductor devices. More specifically, the field of the present invention is directed to junction field effect transistors (JFETS) and MESFETS for use in low voltage, high frequency and high current applications.

2. Related Art

The semiconductor industry faces difficult challenges in satisfying the expanding needs to provide transistors that are suitable for power management with low voltage applications, e.g., below 3 volts. As the feature size of the integrated circuits (ICs) become ever smaller and electronic devices are continuously being miniaturized, the voltages from AC or DC power sources that provide power to these devices are further dropped. Dropping the voltage from five volts to three volts results in a 25 percent reduction in power if the current density is maintained unchanged. At 1.8 volts, the power drops another 60%. However, the transient current loads can be very high. Under such operating conditions, 0.9 volts is the normal forward voltage drop for a p-n junction typically employed in a rectifier. Unfortunately, most of the power is consumed in the rectifying process. Therefore, power supply systems built with such types of p-n junctions are not really suitable for low voltage applications. Even the Schottky barrier diodes with a forward voltage drop below 0.5 volts are not a suitable solution to provide rectifiers or power switching devices for operation under the low voltage conditions.

Junction field effect transistors (JFETs) were developed after the invention of the bipolar transistors. A JFET transistor can be operated at very high frequencies with high switching speeds because the JFET transistor is operated with majority carriers. The depletion mode JFET transistor is well known and employed commonly in a naturally on state when the gate bias is zero. Because of the naturally on state, the JFET transistors are not as widely used in the semiconductor industry as the MOSFET, e.g., the metal oxide semiconductor field effect transistors. In order to make the JFET transistor operate in a naturally off state, the distance between the gates has to be reduced for the depletion regions from the gate to shut off the current conducting paths. However, such naturally off JFET transistors are not very useful in conventional configurations due to the longer current channel thus limiting the current capacity with a high on-resistance. S. M. Sze in "Physics of Semiconductor Devices" disclosed one example of such a configuration (Wiley & Son, 1981 Second Edition, page 322). The normally off JFET transistors discussed by Sze are for high speed low power applications. The long current channel and high-on resistance limit the usefulness of JFET transistors particularly the high on-resistance prevents such transistors for use in applications in modern electronic devices operated with extremely low voltages.

FIG. 1 illustrates a conventional JFET structure 10 having a drain (D) region 16 and an source (S) region 14 which are implemented as wells within a substrate 12. The gate (G) region 18 is also shown. A problem with this conventional JFET structure 10 is that it has a very long channel length thereby creating a large channel resistance. Further, the structure 10 consumes a large substrate surface area because the device 10 is substantially horizontal in orientation with respect to the surface of the substrate. Moreover, the drain 16 and source 14 contacts consume a relatively large amount of space on the substrate 12. Further, gate diffusion is very difficult to control in the JFET structure 10 meaning that the threshold voltage, Vt, is difficult to control.

Moreover, in U.S. Pat. No. 4,523,111 entitled "Normally-Off Gate-Controlled Electric Circuit with Low On-Resistance", Baliga disclosed a JFET serially connected to an IGFET. The gate of the IGFET is operated as the gate for the serially connected circuit. The gate of the IGFET is applied to block the current to flow through a normally on JFET until the IGFET is turned on with a positively biased voltage above an IGFET threshold voltage. The on-resistance is the sum of the JFET resistance and the IGFET resistance. The on-resistance would not be adequate for extremely-low voltage applications required by modern electronic devices as discussed above. A similar invention is disclosed in U.S. Pat. No. 4,645,957 that is entitled "Normally Off Semiconductor Device with Low On-Resistance and Circuit Analogue" by Baliga. The JFET transistor is serially connected to a bipolar transistor to achieve the normally off state. Again, the on-resistance is the sum of the bipolar resistance and the JFET resistance and becomes too high for extremely low voltage applications.

In U.S. Pat. No. 5,321,283 entitled "High Frequency JFET" Cogan et al. disclose a JFET for radio frequency (RF) operation at high frequency. The normally-on JFET transistors disclosed in this patent are operated with high voltage and therefore they are not suitable to satisfy the requirements of modern portable electronic devices that require extremely low voltage and relatively high current capacity. Similarly, in U.S. Pat. No. 5,618,688 entitled "Method of Forming a Monolithic Semiconductor Integrated Circuit having an N-Channel JFET," Ruess et al. disclose a normally on JFET transistor manufactured with BiCMOS processes. The JFET transistors disclosed in this patent are not suitable for low voltage and high current applications.

Therefore, a need exits in the art of design and manufacture of a transistor suitable for low voltage, high current and high frequency applications and a fabrication process that would address the above difficulties.

SUMMARY OF THE INVENTION

Accordingly, embodiments of the present invention are directed to JFETS and MESFETS suitable for low voltage, high current and high frequency applications. Embodiments of the present invention include transistor structures that comprise an oxide layer disposed under the gate region to reduce junction capacitance. Gate length can be very tightly controlled by according to the present invention by partially removing the bottom oxide layer and exposing windows into the substrate. Therefore, Vt can be very accurately controlled according the present invention. For normally off transistor structures, the gate current is reduced at Vg in forward bias. Moreover, silicide is used in the gate structure to further reduce gate resistance. According to the present invention, a very thin gate can be realized, under 1000 angstroms, by dipping of the spacer oxide to allow high frequency applications. Embodiments of the present invention provide the above advantages and others not specifically mentioned above but described in the sections to follow.

Embodiments of the present invention are directed to JFET and MESFET structures (transistor structures), and processes of making same, for low voltage, high channel current and high frequency applications. The structures may be used in normally-on (e.g., depletion mode) or normally-off modes. The structures include an oxide layer positioned under the gate region which effectively reduces the junction capacitance (gate to drain) of the structures. For normally off modes, the transistor structures reduce gate current at Vg in forward bias. In one embodiment, a silicide is positioned in part of the gate to reduce gate resistance. The structures are also characterized in that they have a thin gate due to the dipping of the spacer oxide, which can be below 1000 angstroms. This feature results in fast switching speeds for high frequency applications.

In formation, a trench is etched in a substrate, e.g., n-type. Next, an oxide layer is filled and etched back in the trench leaving a bottom oxide layer in the well of the trench. A spacer oxide and silicon nitride layer is applied to the trench walls, followed by an etch of the bottom oxide in the trench thereby opening windows to the n substrate. A deposition of polysilicon is done, followed by a second spacer oxide deposition and titanium is then deposited. The second oxide layer protects the polysilicon along the trench walls from reacting with the titanium. Thermal processes then form titanium silicide (between the exposed polysilicon and the titanium) in the gate, with the trench oxide disposed below the silicide. During the thermal processes, p regions are formed out of the window regions thereby creating the gate junction. After removal of unwanted material (e.g., the titanium, spacer oxide and polysilicon located along the trench walls), an oxide fill and etch back is performed leaving the silicide and bottom oxide layers. Contact etching is then performed.

For MESFET fabrication, titanium is replaced with platinum and the second spacer oxide is made thinner. The resulting silicide is then platinum silicide. Metal contacts are then used.

More specifically, an embodiment of the present invention includes a junction field effect transistor (JFET) structure comprising: a n+ type substrate forming a drain; an n type substrate disposed on said n+ type substrate and comprising a trench etched therein; an n+ type layer disposed on said n type substrate and forming a source thereon; an oxide bottom layer disposed in a well of said trench; a silicide layer disposed on said oxide bottom layer and forming a gate; a p type region disposed within said n-type substrate and adjacent to said silicide layer; and an oxide fill layer disposed within said trench and on said silicide layer. Embodiments include the above and wherein said silicide layer is titanium silicide and wherein said oxide bottom layer is for reducing gate to drain capacitance and wherein said silicide layer is for reducing gate resistance.

An embodiment of the present invention also includes a MESFET structure comprising: an n+ type substrate forming a drain; an n type substrate disposed on said n+ type substrate and comprising a trench etched therein; an n+ type layer disposed on said n type substrate and forming a source thereon; an oxide bottom layer disposed in a well of said trench; a silicide layer disposed on said oxide bottom layer and extending laterally into said n-type substrate; an oxide fill layer disposed within said trench and on said silicide layer; and metal contacts. Embodiments include the above wherein said silicide layer is platinum silicide and wherein said oxide bottom layer is for reducing gate to drain capacitance and wherein said silicide layer is for reducing gate resistance.

An embodiment of the present invention also includes a process of making a JFET structure comprising the steps of: a) etching a trench in a substrate comprising: an n+ type layer forming a source; an n type substrate; and an n+ substrate forming a drain; b) forming an oxide layer within a well of said trench; c) disposing a first spacer layer on walls of said trench; d) partially etching back said oxide layer to expose windows to said n type substrate between said oxide layer said first spacer layer, said windows for use in controlling the formation of a gate; e) forming a silicide layer on said oxide layer as said gate, said step e) causing lateral diffusion of polysilicon through said windows to form a p region within said n type substrate creating a p-n junction; and f) filling said trench with another oxide layer disposed on said silicide layer.

Embodiments include the above JFET process and wherein said silicide layer is titanium silicide and wherein said step e) comprises the steps of: e1) depositing a layer of polysilicon in said trench; e2) depositing a second spacer layer on portions of said polysilicon layer that reside along said walls of said trench, said second spacer layer for protecting said portions of said polysilicon layer; e3) depositing a titanium layer in said trench; and e4) performing a rapid thermal process to form said titanium silicide layer.

Embodiments of the present invention also include a process of making a MESFET structure comprising the steps of: a) etching a trench in a substrate comprising: an n+ type layer forming a source; an n type substrate; and an n+ substrate forming a drain; b) forming an oxide layer within a well of said trench; c) disposing a first spacer layer on walls of said trench; d) partially etching back said oxide layer to expose windows to said n type substrate between said oxide layer said first spacer layer, said windows for use in controlling the formation of a gate; e) forming a silicide layer on said oxide layer as said gate, said silicide layer diffusing laterally through said windows to form a p region within said n type substrate creating a p-n junction; and f) filling said trench with another oxide layer disposed on said silicide layer.

Embodiments include the above MESFET process and wherein said silicide layer is platinum silicide and wherein said step e) comprises the steps of: e1) depositing a layer of polysilicon in said trench; e2) depositing a second spacer layer on portions of said polysilicon layer that reside along walls of said trench, said second spacer layer for protecting said portions of said polysilicon layer; e3) depositing a platinum layer in said trench; and e4) performing a rapid thermal process to form said platinum silicide layer.

BRIEF DESCRIPTION OF THE DRAWINGS

FIG. 2 and FIG. 3 illustrate a flow diagram of process steps for the fabrication of a JFET transistor in accordance with an embodiment of the present invention.

DETAILED DESCRIPTION OF THE INVENTION

In the following detailed description of the present invention, transistor structures (JFET and MESFET) for low voltage, high current and high frequency applications, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

U.S. Pat. No. 6,251,716, entitled "JFET Structure and Manufacture Method for Low On-Resistance and Low Voltage Application," issued Jun. 26, 2001, and assigned to the assignee of the present invention, is hereby incorporated herein by reference.

Novel JFET Device and Formation Thereof

Figure 1:
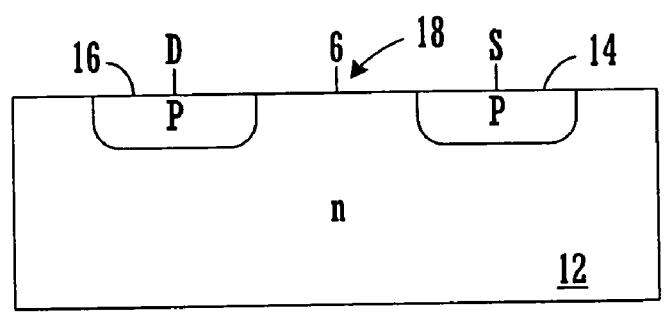
FIG. 1 illustrates a conventional, normally-on, JFET transistor structure.
Figure 3:
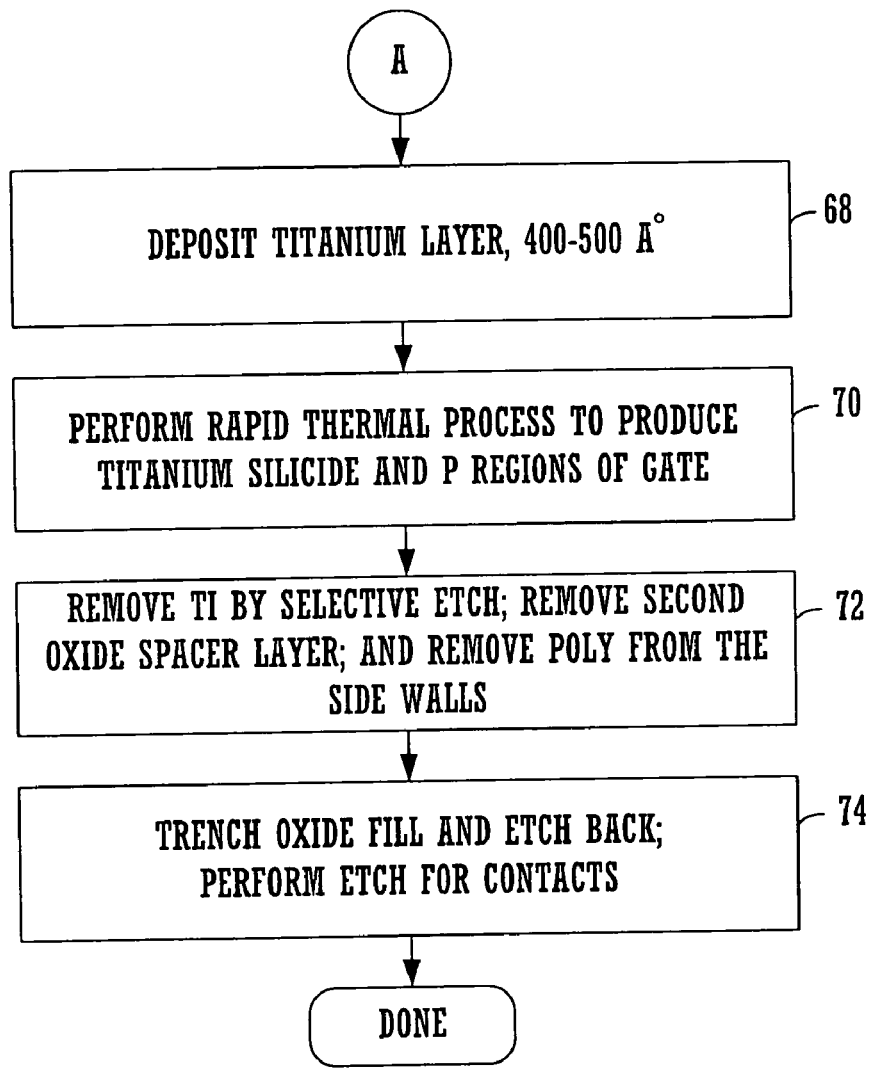

FIGS. 2–3 illustrate a flow diagram of steps 50 used in accordance with an embodiment of the present invention for the fabrication a JFET transistor structure in accordance with an embodiment of the present invention. The JFET fabrication process 50 (of FIGS. 2–3) is described herein in conjunction with FIGS. 4–14. The result of the exemplary JFET transistor structure 150 herein described in shown in FIG. 14.

Figure 4:
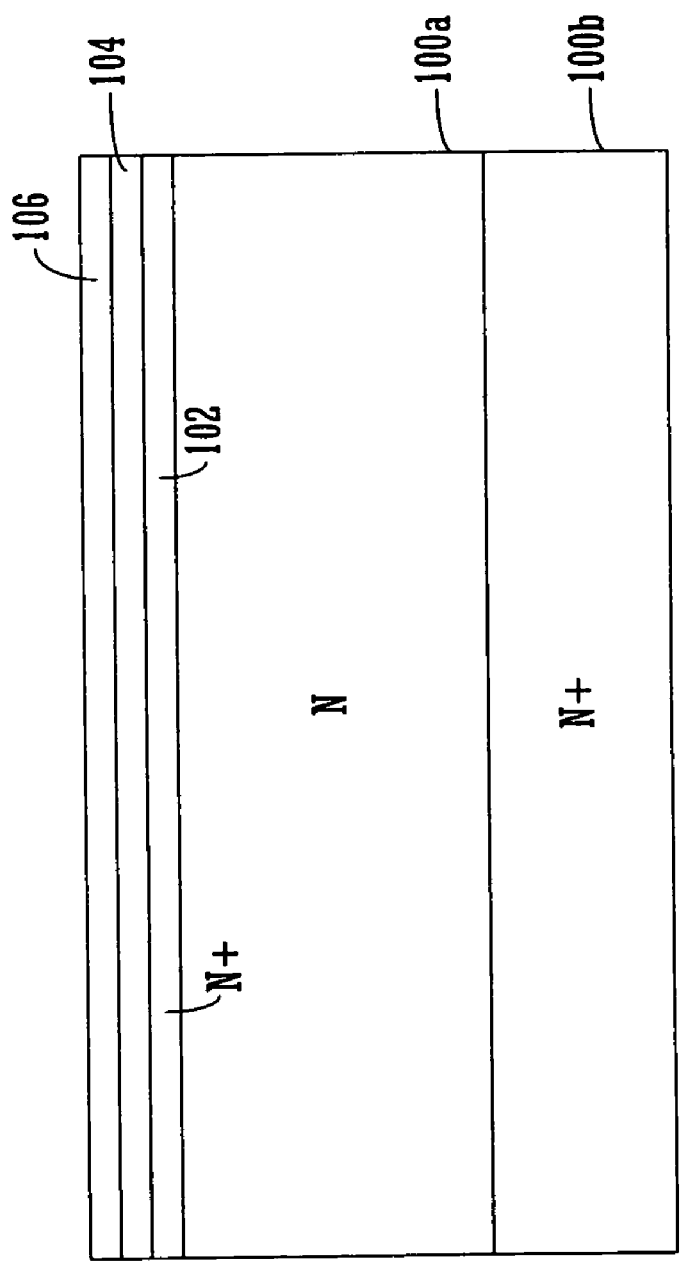
FIG. 4 illustrates an n-type substrate with upper oxide and nitride layers used in the fabrication of a JFET structure in accordance with an embodiment of the present invention.

With reference to FIG. 2 and FIG. 4, at step 52 of FIG. 2, an oxide layer 104 (FIG. 4) and a nitride layer 106 are applied to the surface of an n-type substrate 100a that itself is disposed upon an n+ type layer 100b. It is appreciated that the oxide layer 104 is disposed onto an n+ layer 102 of the n type substrate 100a.

Figure 5:
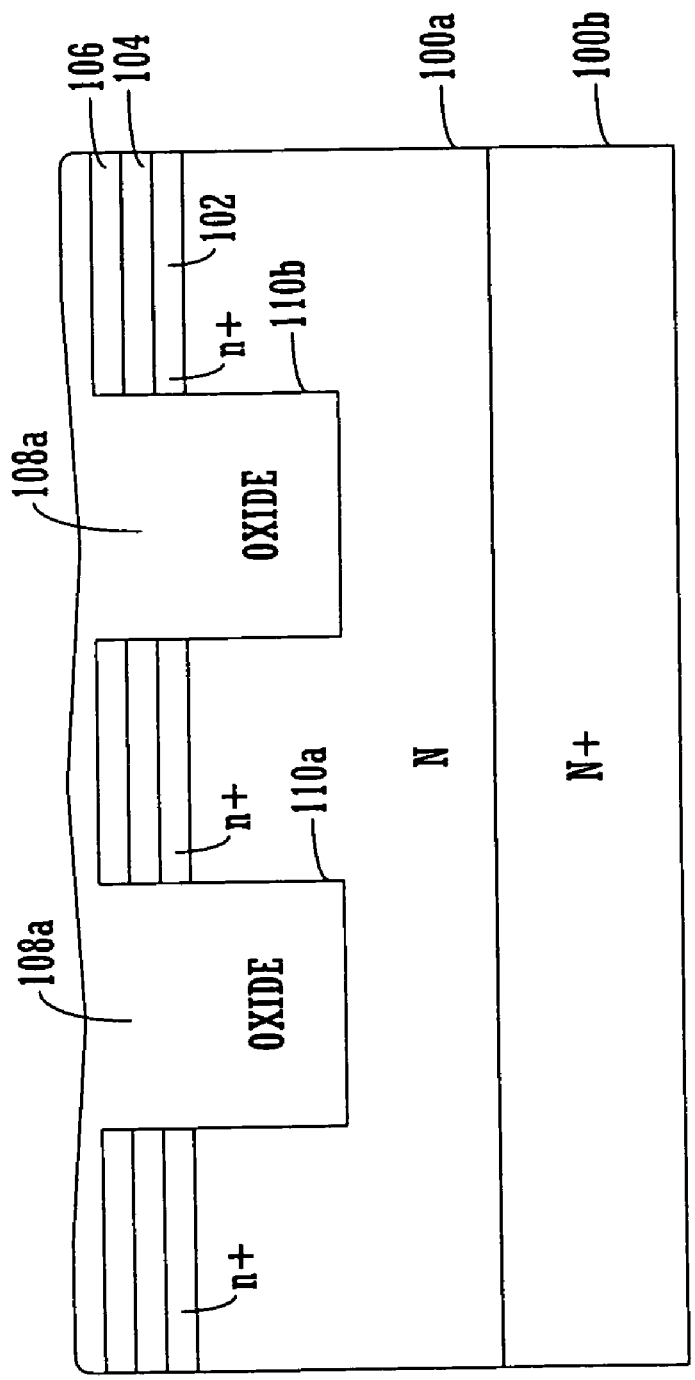
FIG. 5 illustrates the substrate of FIG. 4 with two trenches etched therein and filled with oxide as used in the fabrication of a JFET structure in accordance with an embodiment of the present invention.
Figure 6:
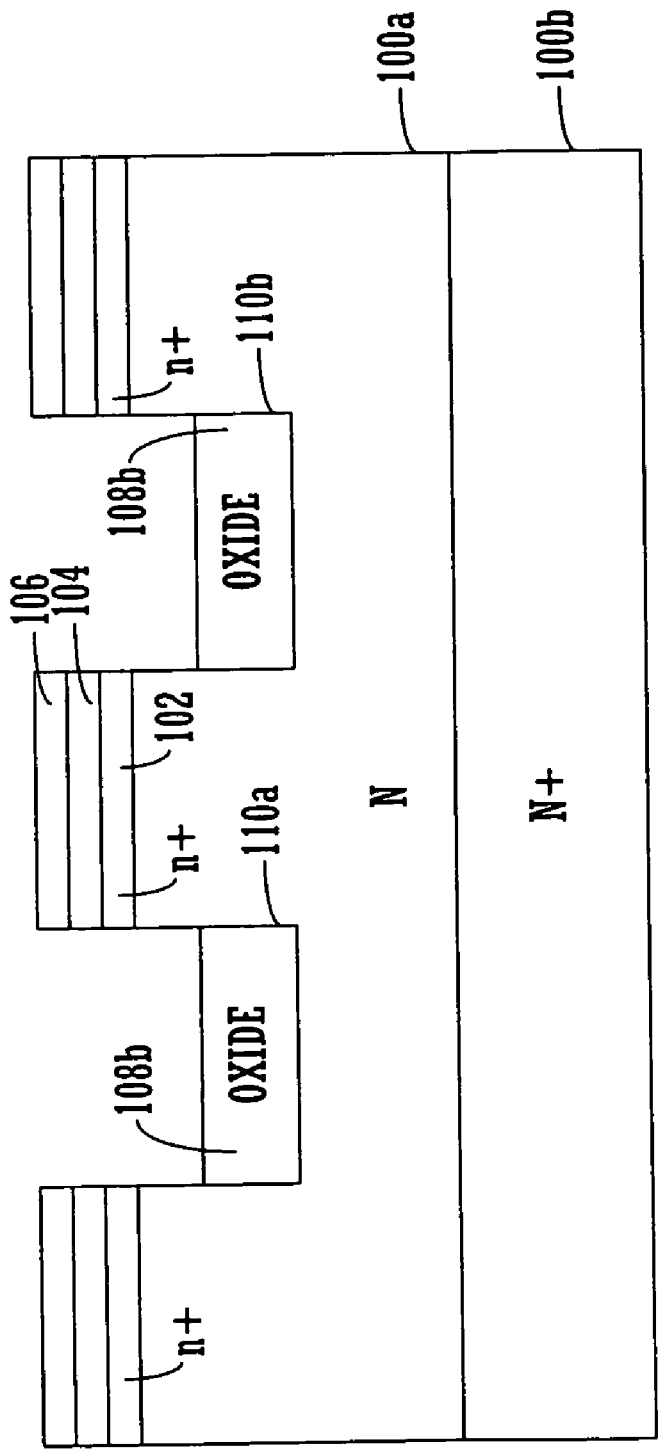
FIG. 6 illustrates the substrate of FIG. 5 with the trench oxide being etched back as used in the fabrication of a JFET structure in accordance with an embodiment of the present invention.

At steps 54–56 of FIG. 2, trenches 110a and 110b are formed in the substrate as shown in FIG. 5 using well known trench etching formation processes. The trenches 110a and 110b are then filled with oxide 108a using well known oxide deposition processes. At step 58, the oxide 108a is then etched back (and down) so that only a small portion 108b of the oxide, e.g., about 3000 angstroms deep, remains at the bottom of the trenches as shown in FIG. 6. This oxide 108b is called the bottom oxide or well oxide herein.

It is appreciated that in an alternative embodiment of the present invention, the oxide fill and etch back steps 56 and 58 can be replaced with a LOCOS process whereby the bottom oxide 108b is grown rather than deposited and etched back. In this alternative embodiment, the bottom oxide 108b would be somewhat "lens" shaped.

Figure 7:
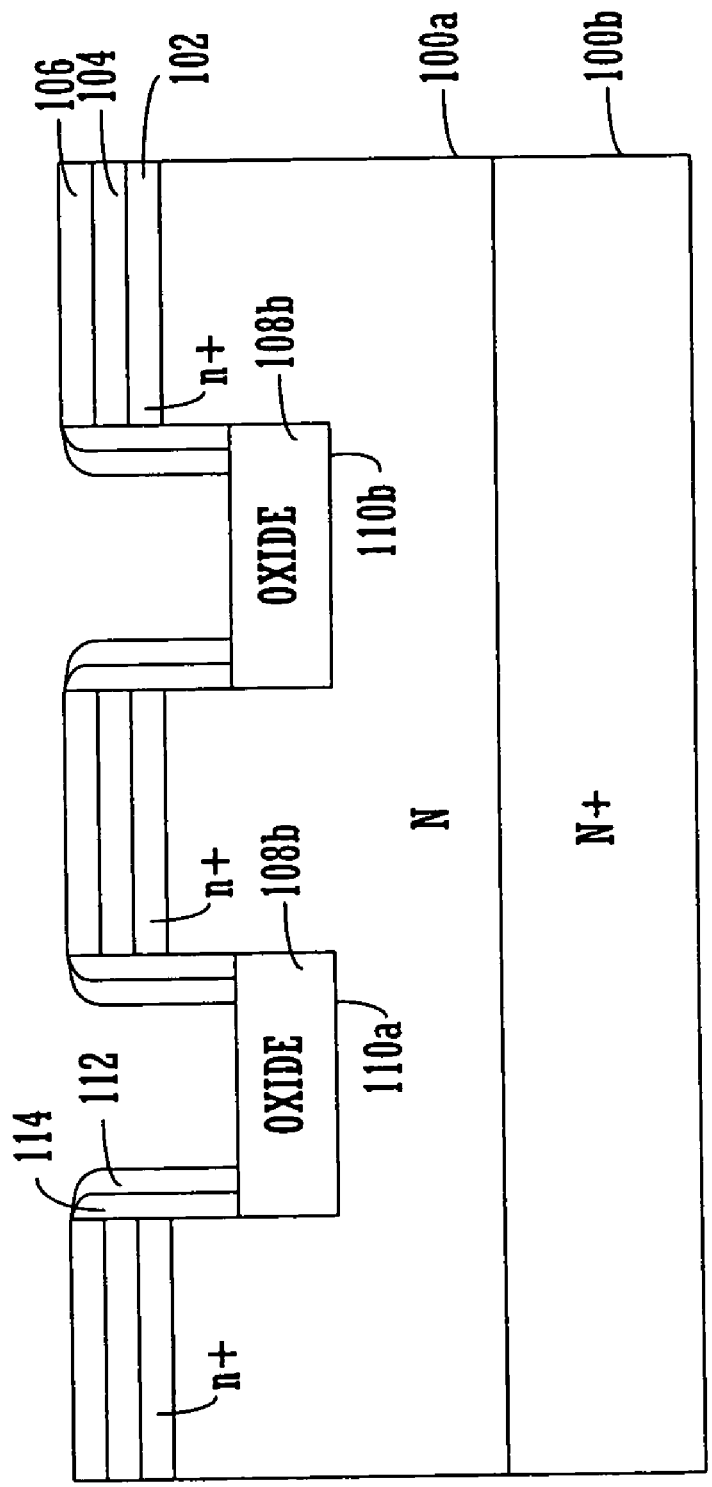
FIG. 7 illustrates the substrate of FIG. 6 with spacer oxide and nitride layers applied to the walls of the trenches as used in the fabrication of a JFET structure in accordance with an embodiment of the present invention.

At step 60 of FIG. 2, as shown in FIG. 7, a spacer oxide layer 114 (SiO2) is deposited along the walls of the trenches 110a–b and then a silicon nitride spacer layer 112 (Si3N4) is deposited on the spacer oxide layer 114. This results in spacer layer 112/114. This first spacer layer 112/114 acts to protect the surrounding substrate layer 100a near the sides of the trenches 10a–b.

Figure 8:
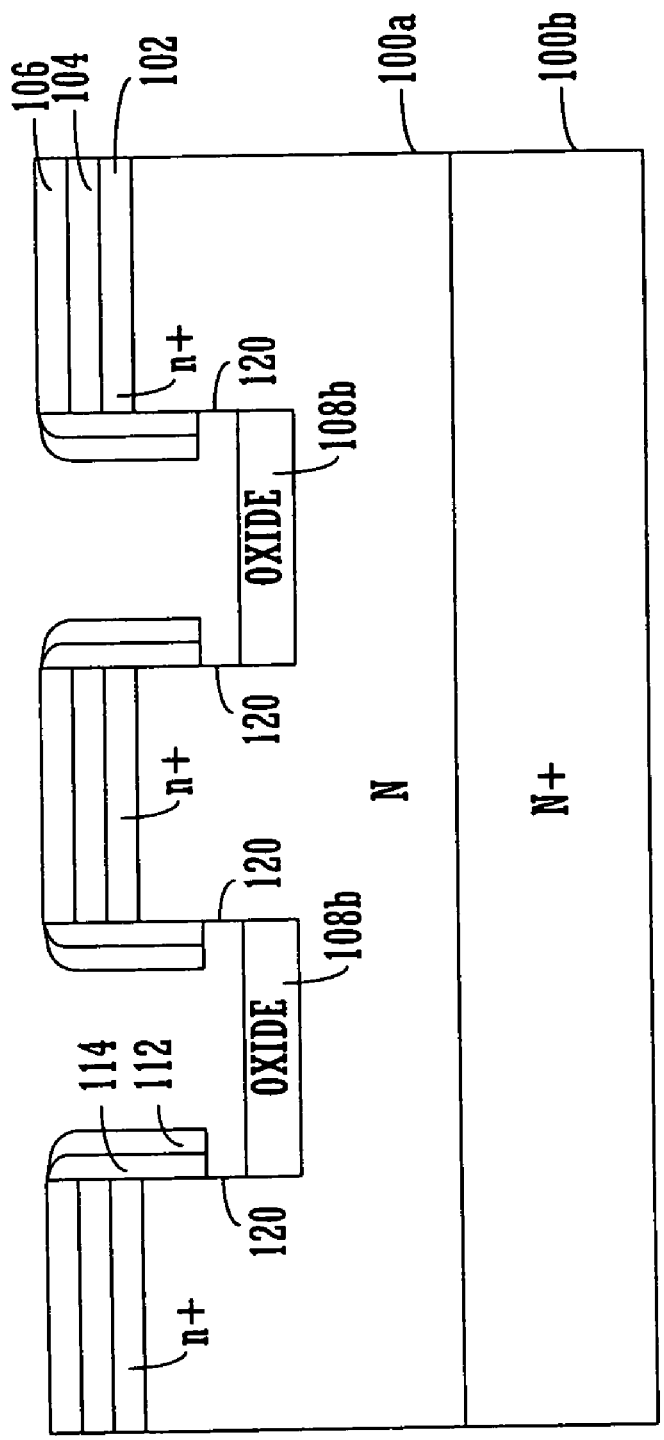
FIG. 8 illustrates the substrate of FIG. 7 with the bottom oxide being etched back to expose windows to the substrate layer as used in the fabrication of a JFET structure in accordance with an embodiment of the present invention.

At step 62 of FIG. 2, as shown in FIG. 8, the bottom oxide 108b is dipped (or etched back) so that about 1000 angstroms of material is removed to expose windows 120 between the top of the bottom oxide 108b and the bottom of the first spacer 112/114. These windows 120, approximately 1000 angstroms tall, are used to tightly control the length of the gate to be formed. In accordance with the present invention, the size of the windows 120 can be adjusted in order to adjust the thickness of the gate region. Therefore, the size of the windows 120 can be adjusted to control the threshold voltage, Vt, of the JFET device 150.

Figure 9:
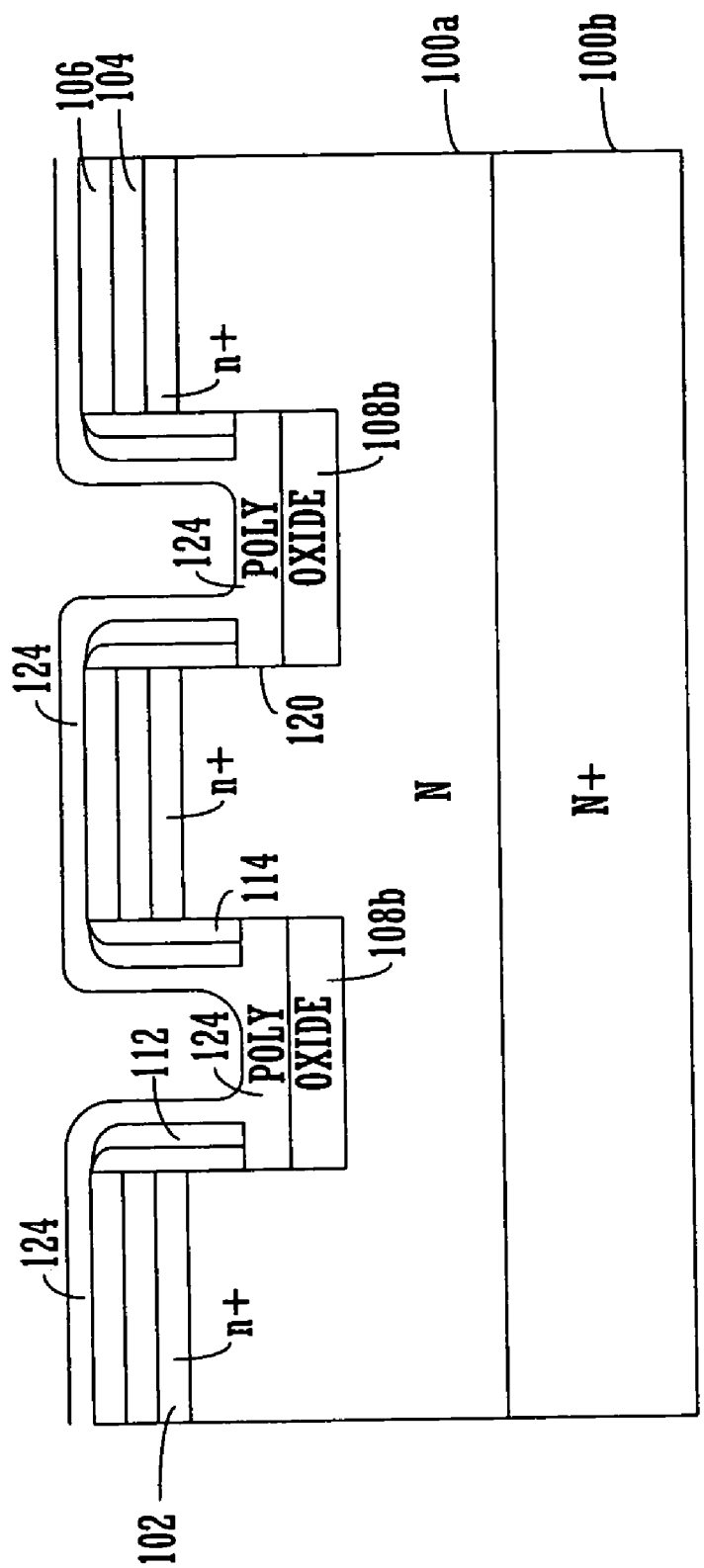
FIG. 9 illustrates the substrate of FIG. 8 with the addition of a polysilicon layer deposition step as used in the fabrication of a JFET structure in accordance with an embodiment of the present invention.

At step 64 of FIG. 2, a polysilicon deposition is performed as shown in FIG. 9 as layer 124. The polysilicon layer 124 is applied along the sides of the trench and also on top of the bottom oxide layer 108b. The polysilicon can be doped, e.g., boron doped, during deposition, or it can be implanted.

Figure 10:
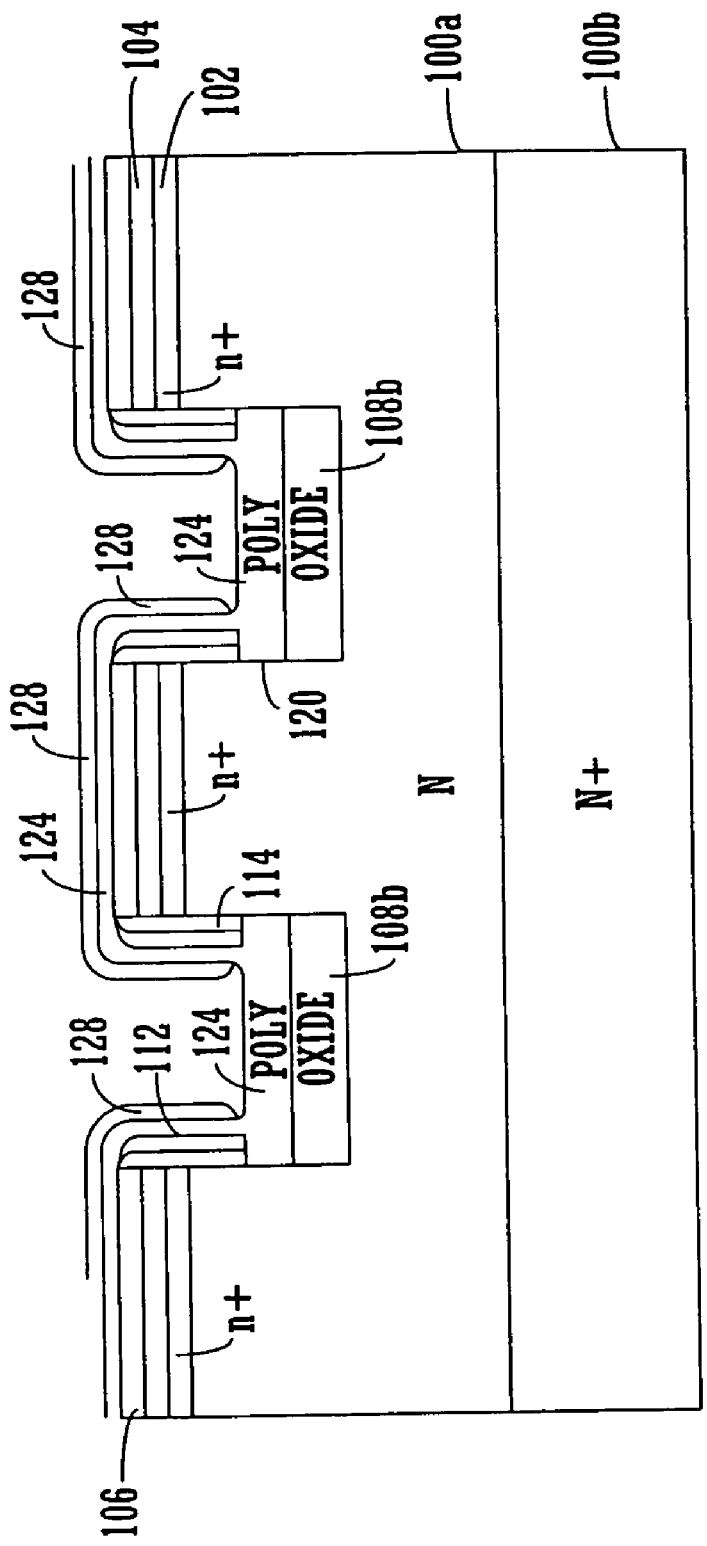
FIG. 10 illustrates the substrate of FIG. 9 with the addition of a second oxide spacer layer deposition step as used in the fabrication of a JFET structure in accordance with an embodiment of the present invention.

At step 66 of FIG. 2, a second spacer layer 128 is deposited. This spacer layer may be an oxide spacer 128 and is etched back to remove it from the top of the polysilicon 124 that exists in the well of the trench as shown in FIG. 10. This second spacer layer 128 may be deposited with film and etched back in well known ways. The second spacer layer 128 is used to protect the polysilicon layer 124 along the trench wall from reacting with metal layers that will be deposited to follow.

Figure 11:
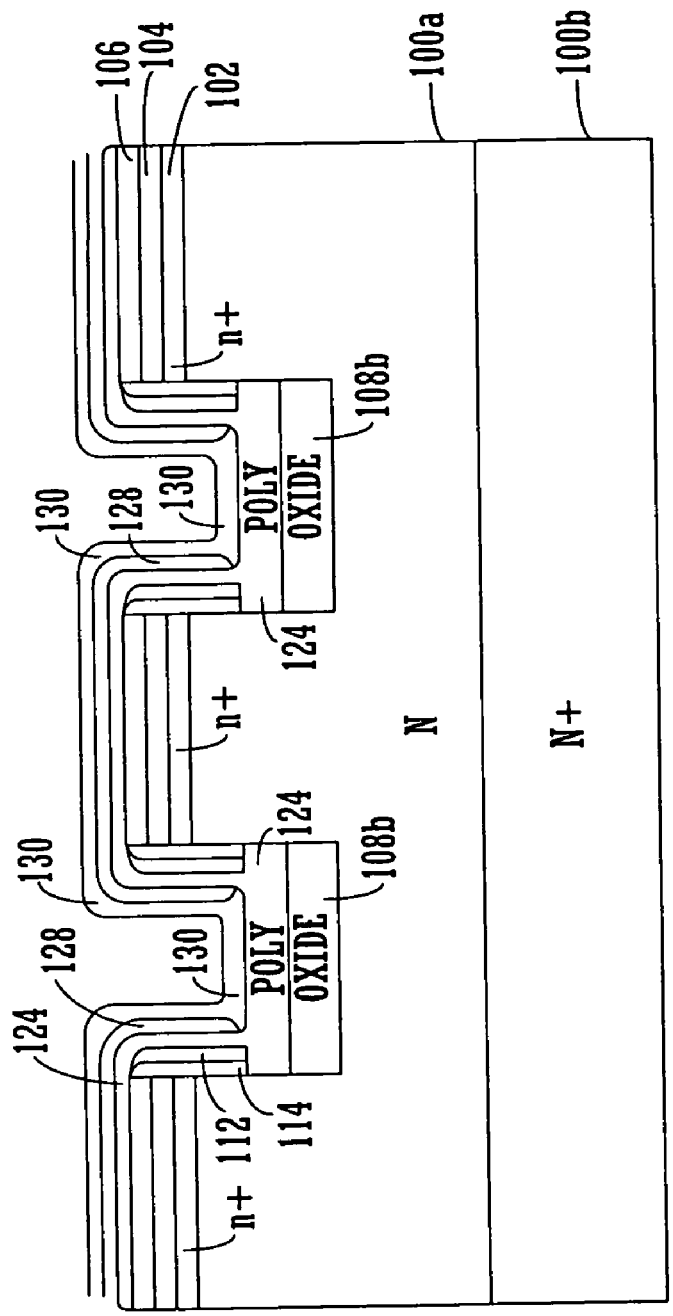
FIG. 11 illustrates the substrate of FIG. 10 with the addition of a titanium layer deposition as used in the fabrication of a JFET structure in accordance with an embodiment of the present invention.

At step 68 of FIG. 3, a layer of titanium 130 is next deposited on the substrate, along the sides of the trenches and in the trench well. This is shown in FIG. 11. In the trench well, the titanium 130 is deposited directly on top of the polysilicon layer 124. In one embodiment, in the trench well, the titanium layer is approximately 400–500 angstroms in thickness.

Figure 12:
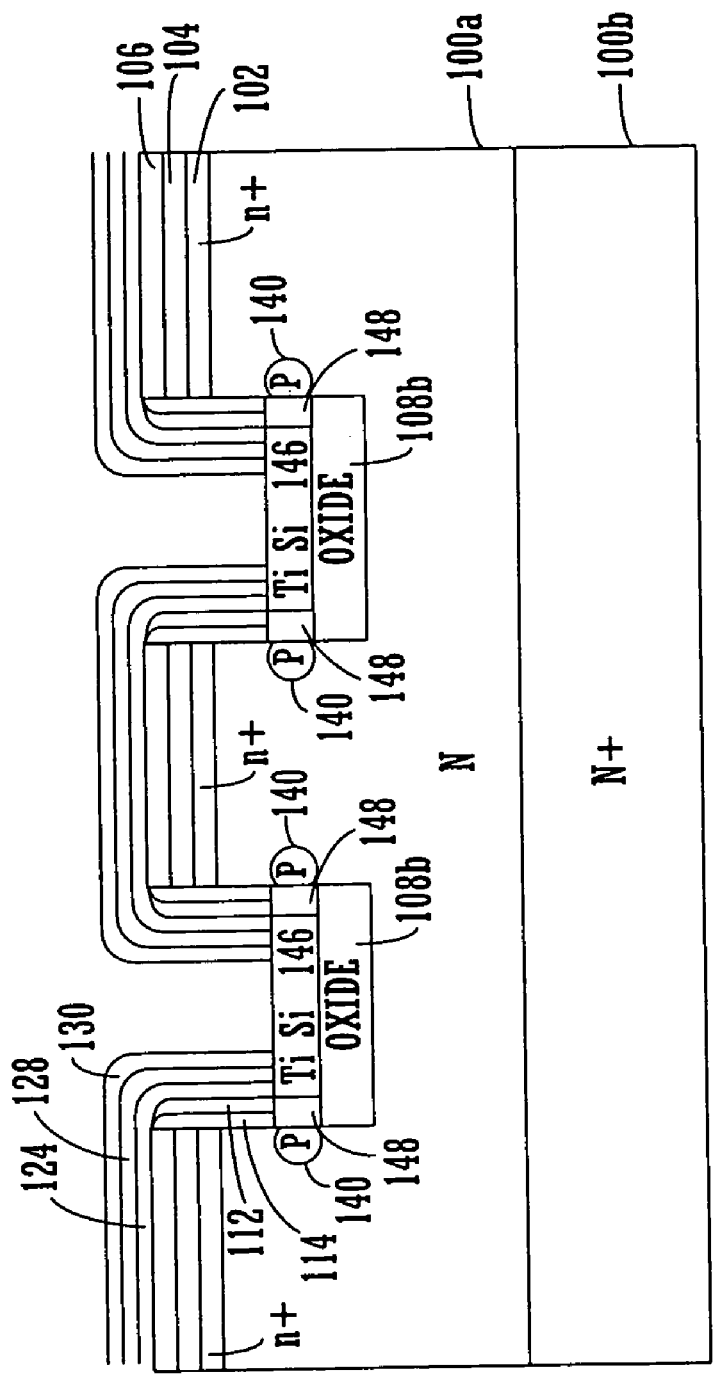
FIG. 12 illustrates the substrate of FIG. 11 after the application of a rapid thermal process and the formation of titanium silicide in the gate region as used in the fabrication of a JFET structure in accordance with an embodiment of the present invention.

Importantly, at step 70 of FIG. 3, the substrate goes through a rapid thermal process (RTP) to form a gate layer of titanium silicide 146 as shown in FIG. 12 which results from the existing titanium layer 130 reacting with the existing polysilicon layer 124 in the trench wells. It is appreciated that the polysilicon 124 along the trench walls does not react in this way because it is protected by the second spacer oxide layer 128 from the titanium 130.

After the RTP process, p regions 140 and polysilicon p regions 148 result from the energetic interaction of the polysilicon layer 124 performing a lateral diffusion. These p regions 140 form the junction of the gate for the JFET structure. The titanium silicide layer 146 resides within the gate and the oxide layer 108b is therefore located under the gate.

Figure 13:
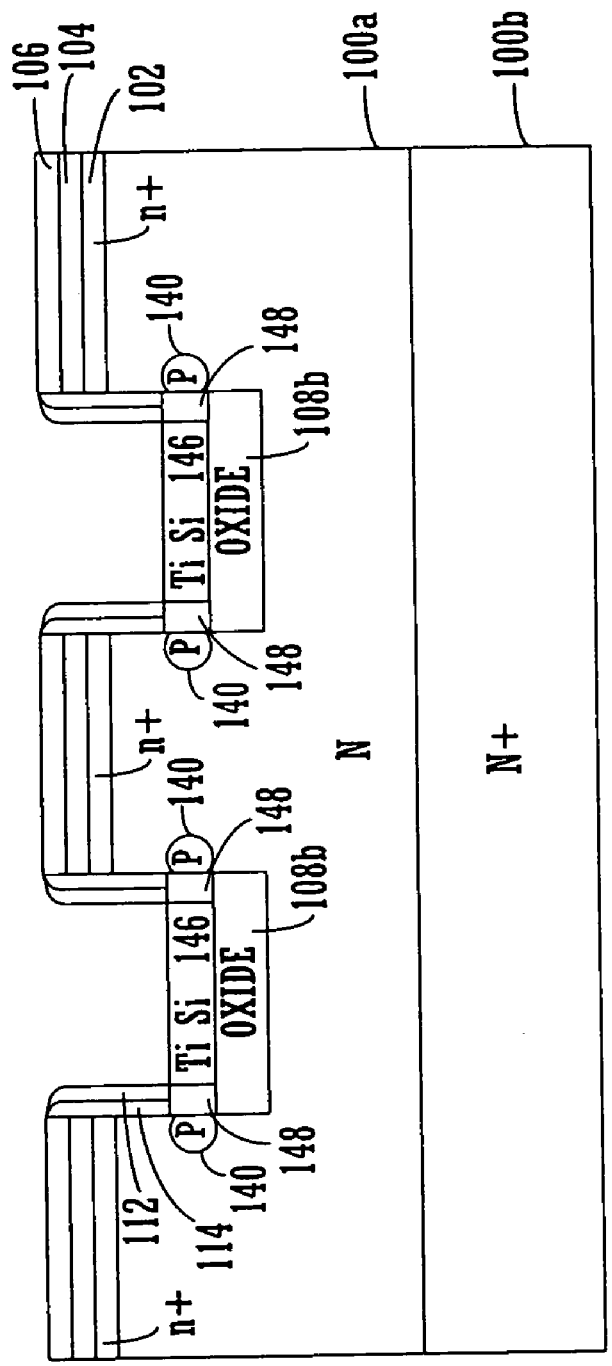
FIG. 13 illustrates the substrate of FIG. 12 after the removal of the remaining titanium, the second spacer oxide and the remaining polysilicon as used in the fabrication of a JFET structure in accordance with an embodiment of the present invention.

At step 72, the extra titanium layer 130 located along the side walls of the trench is removed using a selective etch, e.g., using a hydrogen peroxide or "SC1" process. Importantly, this selective etch step does not remove the titanium silicide layer 146. Next, the extra second spacer material 128 located along the side walls of the trench is removed using a diluted HF solution. Lastly, the extra polysilicon layer 124 along the sides of the trench walls is removed using a diluted solution of $NH_4$ and HF ($NH_4HF$), or any other well known chemical process could be used. The net result of the above steps 50 is shown in FIG. 13. The only remaining chemicals in the sides of the trench walls are the first spacer 112/114 which may optionally be removed.

Figure 14:
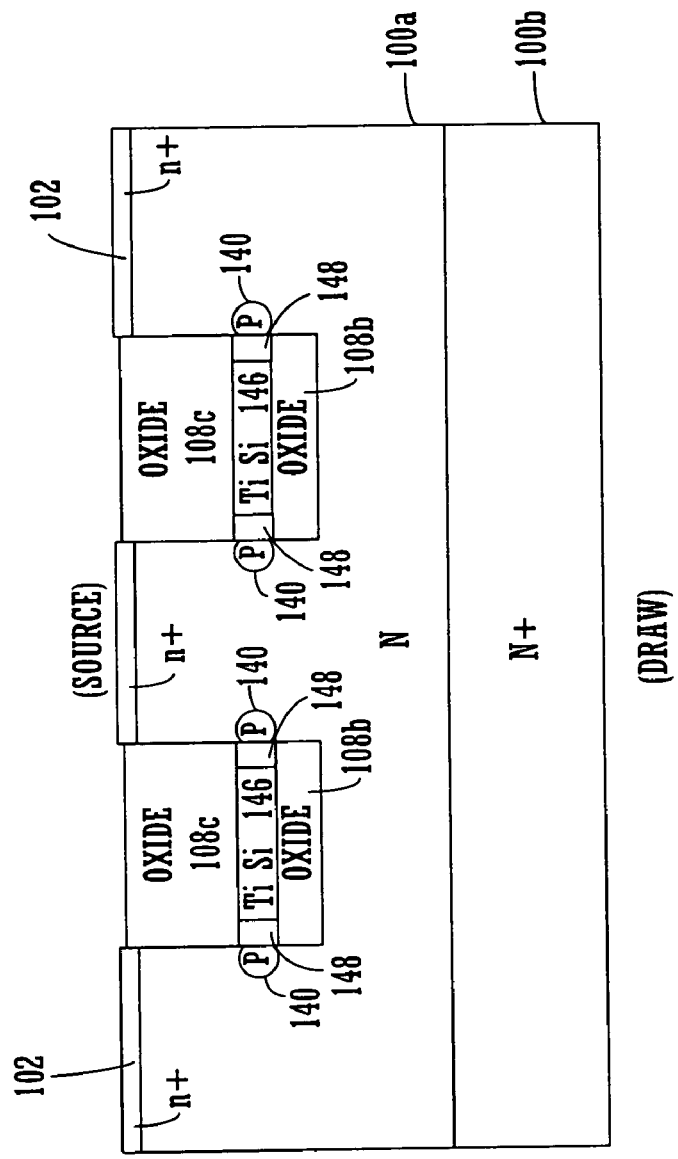
FIG. 14 illustrates the substrate of FIG. 13 after an oxide fill and etch back steps are performed as used in the fabrication of a JFET structure in accordance with an embodiment of the present invention.

At step 74, the trenches are filled with oxide 108c and then etched back using well known processes. Contact etching is then performed. The result of the fabrication process 50 is shown in FIG. 14 which illustrates a JFET structure 150 in accordance with one embodiment of the present invention. The gate is formed sideways. In this embodiment, the drain is located at the bottom and the source is located at the top. The oxide layer 108b under the gate is instrumental in reducing gate to drain capacitance. Also, the small surface of the p-n junction acts to reduce its capacitance. In other words, the exposure of the p-n junction is reduced in order to substantially reduce the junction capacitance over the prior art designs. The silicide layer 146 located in the gate region is useful in reducing the gate resistance. The very thin gate, e.g., 1000 angstroms or less, results in fast switching speed, therefore, the JFET structure 150 is good in high frequency applications. It is appreciated that the narrow gate also yields a small RDS on (on resistance, drain to source). Also, the protruding p regions 140 reduce the junction capacitance of the JFET device 150.

The formation of the windows 120 (FIG. 8) provides flexible control for the formation of the gate in the amount of diffusion that is performed based on the amount of oxide that dipped off. This allows the threshold voltage, Vt, to be tightly controlled based, in part, on the height of the windows 120.

As a result of the above features, and specially due to the oxide layer 108b disposed below the gate, the novel JFET structure 150, which can be used in normally-on or normally-off modes, has: (1) reduced gate current; (2) reduced gain-drain capacitance; and (3) low gate resistance.

Because the JFET 150 can be used in a mode of operation that is forward bias through the gate, the smaller p-n junction at the gate is effective to reduce otherwise wasted current flow there through. Another advantage of the JFET structure 150 is that it is fabricated in a vertical orientation with respect to the substrate. Therefore, the structure 150 can be made more compact and therefore may be densely packed for dense IC designs.

Novel MESFET Device and Formation Thereof

Figure 15:
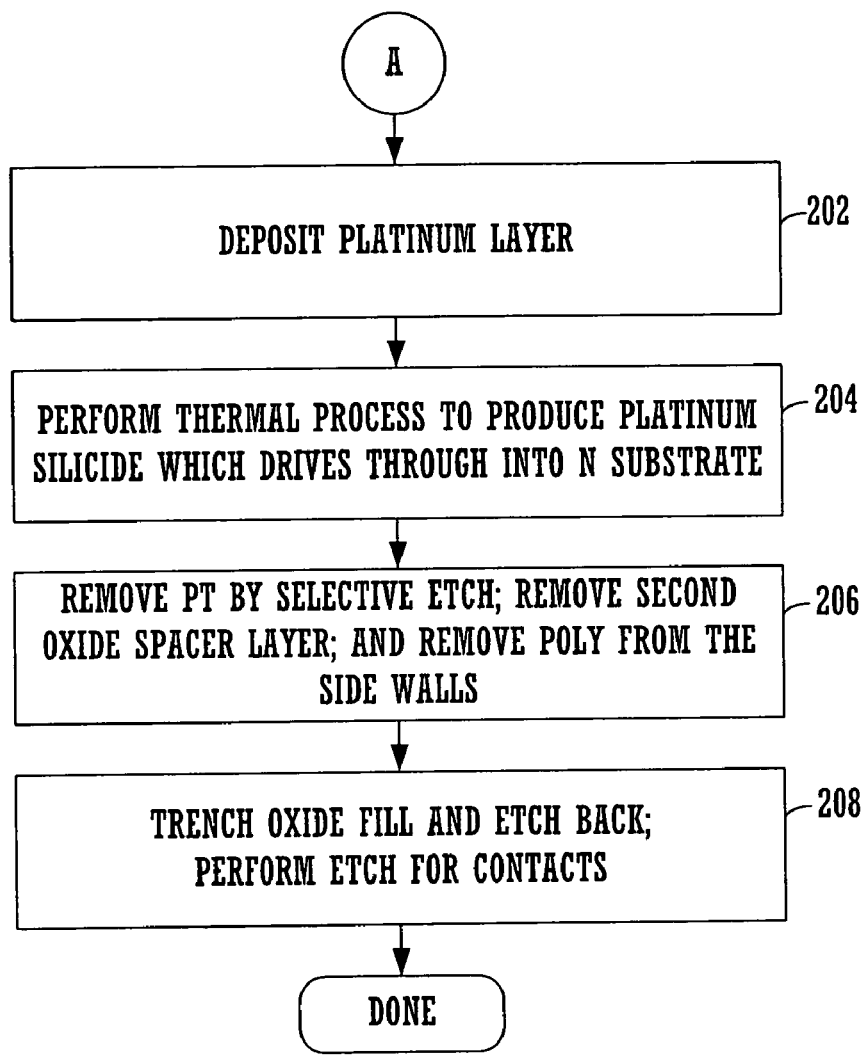
FIG. 15 (and FIG. 2) illustrate a flow diagram of steps performed in accordance with an embodiment of the present invention for the fabrication of a MESFET transistor structure.

FIG. 15 illustrates a process 200 for forming a novel MESFET device in accordance with another embodiment of the present invention. The first eight steps of process 200 are similar to steps 52–66 as shown in FIG. 2 for the fabrication of the JFET structure 150 discussed above; except that the second spacer oxide layer 128' (FIG. 16) is made thinner for the MESFET embodiment. The fabrication process 200 of the MESFET 250 (FIG. 19) is discussed in conjunction with FIGS. 16–19.

Figure 16:
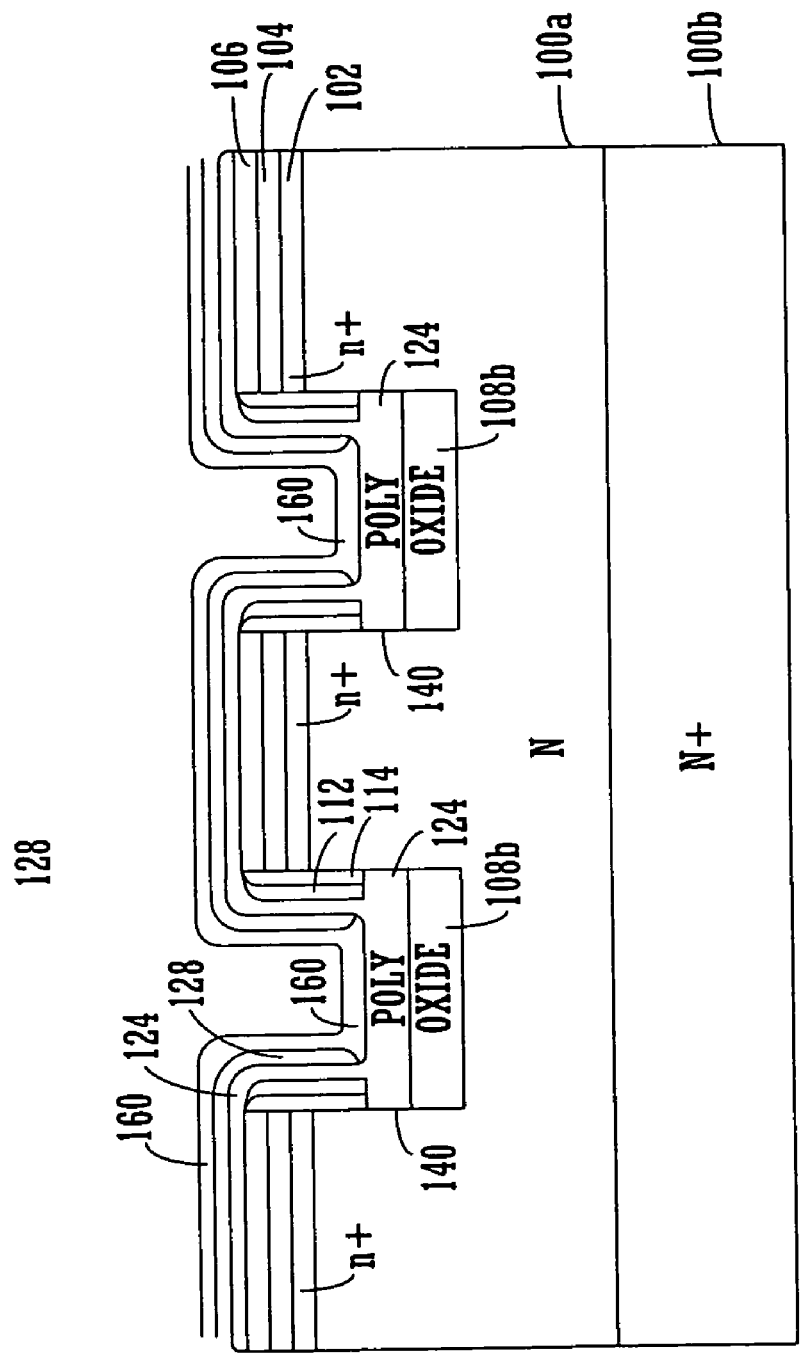
FIG. 16 illustrates the substrate of FIG. 10 with the deposition of a platinum layer as used in the fabrication of a MESFET structure in accordance with an embodiment of the present invention.

At step 202, instead of depositing titanium, as done in the JFET structure 150 of the present invention, the MESFET fabrication process 200 utilizes a platinum deposition at step 202. This is shown in FIG. 16. At step 202 of FIG. 15, a layer of platinum 160 is deposited on the substrate, along the sides of the trenches and in the trench wells. In the trench wells, the platinum 160 is deposited directly on top of the polysilicon layer 124. In one embodiment, in the trench wells, the platinum layer 160 is approximately 400–500 angstroms in thickness.

Figure 17:
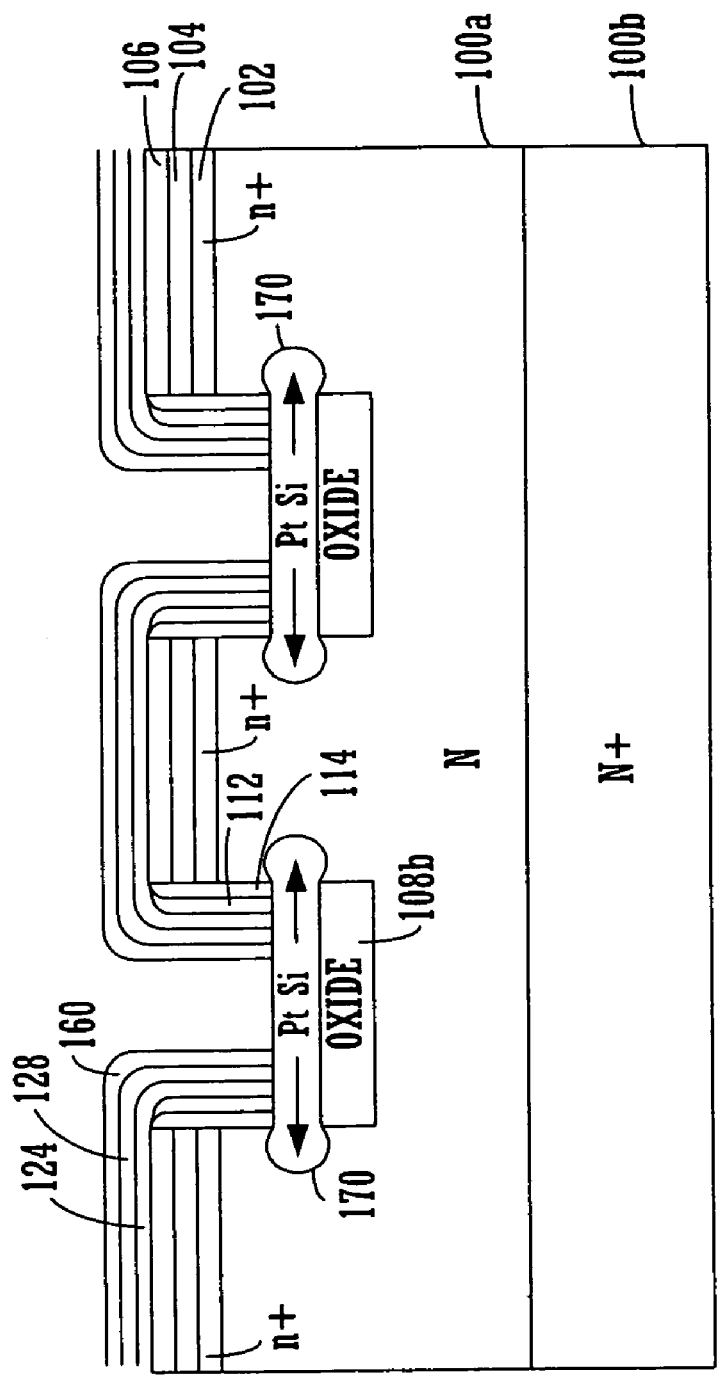
FIG. 17 illustrates the substrate of FIG. 16 after the application of a thermal process that forms the platinum silicide layer as used in the fabrication of a MESFET structure in accordance with an embodiment of the present invention.

Importantly, at step 204 of FIG. 15, the substrate goes through a thermal process, cooler than the RTP of step 70 (FIG. 3), to form a gate layer of platinum silicide 170 as shown in FIG. 17 which results from the existing platinum layer 160 reacting with the existing polysilicon layer 124 in the trench well (but not along the trench walls). Also, by lateral diffusion, the platinum silicide 170 extends into the n-type substrate 100a as shown in FIG. 17. This forms the gate junction. It is appreciated that the polysilicon layer 124 along the trench walls does not react in this way because it is protected by the second spacer oxide layer 128' from the platinum layer 160. It is appreciated that the second oxide layer 128' is made thinner because the thermal process used for the formation of the platinum silicide 170 is not as hot as the RTP used in step 70. Therefore, the platinum 160 requires more help to extend into the polysilicon layer 124 and the n-type substrate 100a for reaction therewith.

After the thermal process of step 204, platinum silicide 170 layer results from the interaction of the platinum 160 and the polysilicon layer 124. These edges of the platinum silicide 170 form the junction of the gate for the MESFET transistor structure. The platinum silicide 170 resides within the gate and the oxide layer 108b is therefore located under the gate.

Figure 18:
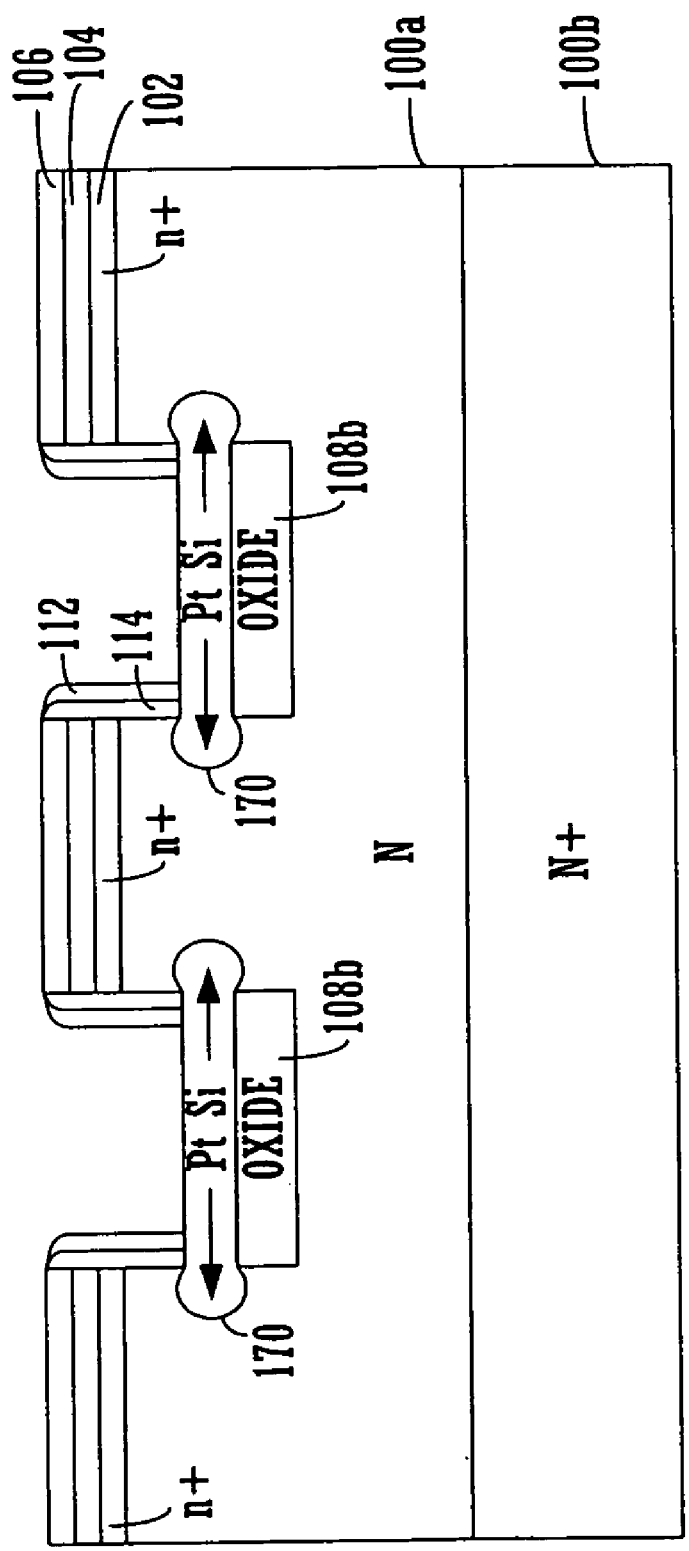
FIG. 18 illustrates the substrate of FIG. 17 after the removal of the remaining platinum layer, the second spacer oxide and the remaining polysilicon layer as used in the fabrication of a MESFET structure in accordance with an embodiment of the present invention.

At step 206, the extra platinum layers 160 located along the side walls of the trench are removed using a selective etch, e.g., using a hydrogen peroxide or "SC1" process. It is appreciated that the selective etching step does not remove the silicide layer 170. Next, the extra second spacer material 128' located along the side walls of the trenches is removed using a diluted HF solution. Lastly, the extra polysilicon 124 along the sides of the trench walls is removed using a diluted solution of $NH_4$ and HF ($NH_4HF$), or any other well known chemical process may also be used. The net result of the above steps 200 is shown in FIG. 18. The only remaining chemicals in the sides of the trench walls are the first spacer 112/114 which may optionally be removed.

At step 208, the trenches are filled with oxide 108c and then etched back (trench etch) using well known processes. Contact etching is then performed. A metal is used as the contacts, e.g., aluminum may be used.

Figure 19:
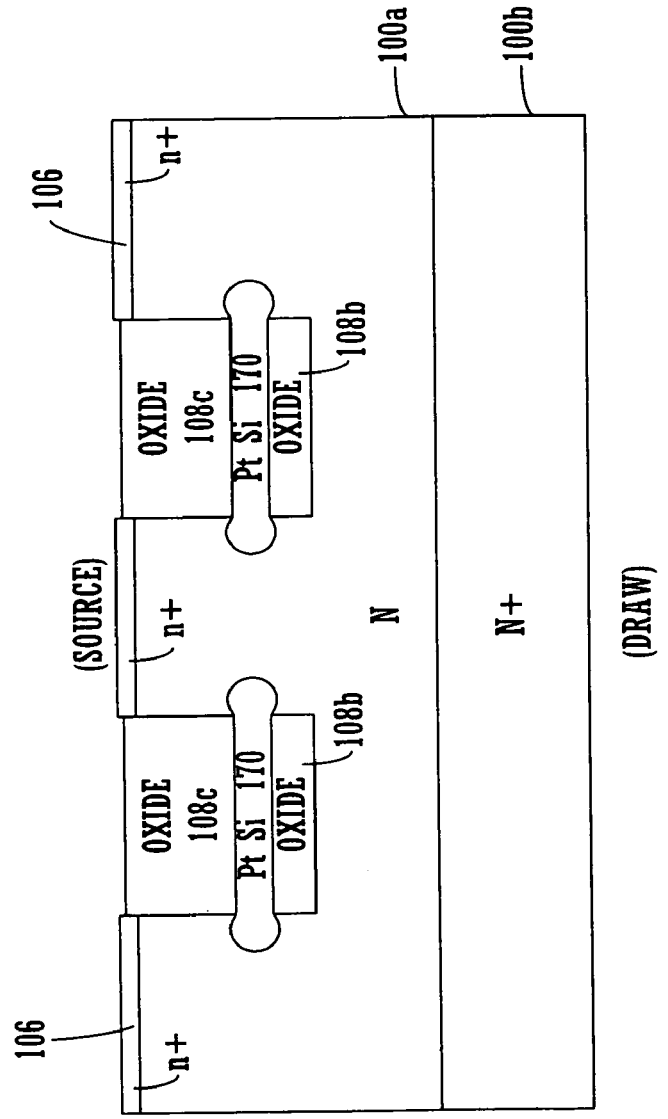
FIG. 19 illustrates the substrate of FIG. 18 after oxide fill and etch back steps are performed as used in the fabrication of a MESFET structure in accordance with an embodiment of the present invention.

The result of the fabrication process 200 is shown in FIG. 19 which illustrates a MESFET structure 250 in accordance with an embodiment of the present invention. The gate is formed sideways. In this embodiment, the drain in located at the bottom and the source is located at the top. The oxide layer 108b under the gate is instrumental in reducing gate to drain capacitance. Also, the small surface of the p-n junction acts to reduce its capacitance. In other words, the exposure of the p-n junction is reduced in order to substantially reduce the junction capacitance over the prior art designs. The gate region silicide layer 170 is useful in reducing the gate resistance. The very thin gate, e.g., 1000 angstroms or less, results in fast switching speed, therefore, the MESFET structure 150 is good in high frequency applications. It is appreciated that the narrow gate also yields a small RDS on (on resistance, drain to source). Also, the protruding p regions 140 reduce the junction capacitance of the device.

The formation of the windows 120 (FIG. 8) provides great control for the formation of the gate in the amount of diffusion that is performed based on the amount of oxide that dipped off during the fabrication of the MESFET 250. This allows Vt to be tightly controlled based on the window size.

As a result of the above features, and specially due to the oxide layer 108b below the gate, the novel MESFET structure 250, which can be used in a normally-on or normally-off mode, has: (1) reduced gate current; (2) reduced gain-drain capacitance; and (3) low gate resistance.

Because the MESFET 250 can be used in a mode of operation that is forward bias through the gate, the smaller p-n junction at the gate is effective to reduce otherwise wasted current flow there through. Another advantage of the MESFET structure 250 is that it is fabricated in a vertical orientation with respect to the substrate. Therefore, the structure 250 can be made more compact and therefore may be densely packed for dense IC designs.

The preferred embodiment of the present invention, transistor structures (JFET and MESFET) for low voltage, high current and high frequency applications, are thus described. While the present invention has been described in particular embodiments, it should be appreciated that the present invention should not be construed as limited by such embodiments, but rather construed according to the below claims.

What is claimed is:

1. A process of making a JFET structure comprising the steps of:
    (a) etching a trench in a substrate, wherein the substrate comprises a layered structure including an n+ type layer forming a source, an n type layer, and an n+ type layer forming a drain;
    (b) forming a bottom oxide layer within a well of said trench;
    (c) depositing a first spacer layer on walls of said trench;
    (d) partially etching back said bottom oxide layer to form windows between said bottom oxide layer and said first spacer layer, wherein said windows expose portions of said n type layer;
    (e) forming a doped polysilicon layer on said etched bottom oxide layer, and within said windows;
    (f) annealing said doped polysilicon layer to form a gate silicide layer on said etched bottom oxide layer, so that portions of said doped polysilicon layer remain within said windows; wherein said annealing further forms p-type regions by laterally diffusing impurities from said doped polysilicon into said n type layer, creating a p-n junction; and
    (g) filling said trench with another oxide layer deposited on said silicide layer.

2. A process as described in claim 1 wherein said gate silicide layer is titanium silicide.

3. A process as described in claim 1 wherein said windows are respectively approximately 1000 A in height.

4. A process as described in claim 1 wherein said first spacer layer comprises a silicon oxide layer and silicon nitride layer.

5. A process as described in claim 2 wherein said step (f) comprises the steps of:
    e1) depositing a second spacer layer on portions of said doped polysilicon layer that reside along said walls of said trench;
    e2) depositing a titanium layer in said trench; and
    e3) performing said annealing step to form said titanium silicide layer.

6. A process as described in claim 5 wherein said step e) further comprises the step of using a selective etch to remove said titanium layer while leaving said titanium silicide layer.

7. A process as described in claim 6 further comprising the step of removing said second spacer layer and said doped polysilicon layer.

8. A process as described in claim 1 wherein said step b) comprises the step of performing a LOCOS process to grow said bottom oxide layer within said well.

* * * * *